(12) United States Patent
Dover et al.

(10) Patent No.: US 7,808,274 B2
(45) Date of Patent: Oct. 5, 2010

(54) MONOLITHICALLY INTEGRATED MULTIPLEXER-TRANSLATOR-DEMULTIPLEXER CIRCUIT AND METHOD

(75) Inventors: Frank Dover, Mesa, AZ (US); James Lepkowski, Glendale, AZ (US); Aurelio Pimentel, Shanghai (CN)

(73) Assignee: Semiconductor Components Industries, LLC, Phoenix, AZ (US)

( * ) Notice: Subject to any disclaimer, the term of this patent is extended or adjusted under 35 U.S.C. 154(b) by 38 days.

(21) Appl. No.: 11/966,723

(22) Filed: Dec. 28, 2007

(65) Prior Publication Data

US 2009/0167356 A1 Jul. 2, 2009

(51) Int. Cl.
*H03K 19/0175* (2006.01)
*H03L 5/00* (2006.01)

(52) U.S. Cl. .............................. 326/63; 326/82; 327/333
(58) Field of Classification Search ........................ None
See application file for complete search history.

(56) References Cited

U.S. PATENT DOCUMENTS

| | | | | |
|---|---|---|---|---|
| 5,850,155 | A * | 12/1998 | Matsumoto | 326/109 |
| 6,127,846 | A * | 10/2000 | McClintock et al. | 326/41 |
| 6,856,173 | B1 * | 2/2005 | Chun | 326/108 |
| 7,259,589 | B1 * | 8/2007 | Hui et al. | 326/63 |
| 2004/0125067 | A1 * | 7/2004 | Kim et al. | 345/98 |

OTHER PUBLICATIONS

Maxim, Industry's First Ultra-Broadband HDMI/DVI Switches, Maxim Direct, Arrow, Avnet Electronics Marketing, Digi-Key and Newark, Circle No. 125.

* cited by examiner

*Primary Examiner*—Vibol Tan
*Assistant Examiner*—Dylan White
(74) *Attorney, Agent, or Firm*—Rennie William Dover

(57) ABSTRACT

A monolithically integrated multiplexer-translator-demultiplexer and a method for multiplexing and translating an electrical signal or demultiplexing and translating an electrical signal. A multiplexer and a demultiplexer are monolithically integrated with a translator. Circuits that operate at different voltage supply levels from each other may be coupled to the multiplexer and a circuit that operates at a different voltage supply level from the circuits coupled to the multiplexer or that operates at the same voltage supply level as at least one of the circuits coupled to the multiplexer is coupled to the demultiplexer. The monolithically integrated multiplexer-translator-demultiplexer selects a signal from one of the circuits coupled to the multiplexer, translates its voltage level and provides the translated signal level as an output signal. Alternatively, the monolithically integrated multiplexer-translator-demultiplexer creates demultiplexed signals from an electrical signal and translates the voltage levels of the demultiplexed signals.

20 Claims, 10 Drawing Sheets

$204_n, 208_n, 212_n$ $206_n, 210_n, 214_n$

MONOLITHICALLY INTEGRATED MULTIPLEXER-TRANSLATOR-DEMULTIPLEXER CIRCUIT AND METHOD

TECHNICAL FIELD

The present invention relates, in general, to electronics and, more particularly, to methods of forming semiconductor devices and structure.

BACKGROUND

Many electronic systems are implemented using integrated circuits of different logic families. For example, computer systems often use complementary metal-oxide-semiconductor ("CMOS") circuits to perform computational functions, low voltage differential signaling ("LVDS") circuits for disk drive data signals, and positive emitter-coupled logic ("PECL") circuits for clock drivers. These logic circuits are typically incompatible with each other in the sense that voltage levels specified for circuits of one logic family do not fall within the voltage range specified for circuits of a different logic family. Hence, data is lost or noise immunity is substantially impaired. For this reason, a receiver-translator circuit often is used to translate between signals of different logic families.

In addition to interfacing different logic families with each other, it may be desirable to interface different systems with each other. For example, many applications it is desirable to have a microprocessor capable of transmitting data to and receiving data from a multimedia card (MMC), or to have a microprocessor capable of transmitting data to and receiving data from a secure digital input/output (SDIO) system, or to have a microprocessor capable of transmitting data to and receiving data from a plurality of systems such as an MMC and an SDIO system. The microprocessor is also referred to as a central processing unit. Thus, the microprocessor should be capable of operating with one or more systems having different voltage parameters than the microprocessor and with each other. Interfacing different logic circuits, different transceivers, and different systems requires the use of different discrete translators to allow communications between the different circuit components. For example, a system may include a multiplicity of discrete circuit components coupled to an input of a translator and a discrete circuit component coupled to the output of the translator where the discrete circuit component coupled to the output of the translator has a different operating voltage than one or more of the circuit components connected to the input of the translator. This results in a higher system cost because of the need to inventory multiple translators and, since fewer translators of each type are used, the lack of economies of scale.

In addition to a higher cost, systems that include components that operate at different voltages may require additional circuitry to overcome incompatible supply voltage levels or may be limited in the acceptable supply voltages. For example, FIG. 1 illustrates a prior art logic voltage translator 10 used in a multiplexing application in which a plurality of circuits coupled to the inputs of the translator are limited to having the same voltage supply levels. What is shown in FIG. 1 is an n-channel pass transistor 12 coupled to p-channel edge-adjusting transistors 14 and 20 through corresponding one-shots 16 and 22, respectively. Pull-up resistors 18 and 24 are connected to p-channel edge-adjusting transistors 14 and 20, respectively. More particularly, n-channel pass transistor 12 has a source connected to an input/output node 26, a drain connected to an input/output node 28 and a gate coupled for receiving a source of operating potential $V_{CC1}$. The drain of pass transistor 12 is coupled to the gate of edge-adjusting transistor 14 through one-shot 16 and the source of pass transistor 12 is coupled to the gate of edge-adjusting transistor 20 through one-shot 22. The source of pass transistor 12 is connected to a drain of edge-adjusting transistor 14 and to a terminal 19 of pull-up resistor 18 and the drain of pass transistor 12 is connected to a drain of edge-adjusting transistor 20 and to a terminal 25 of pull-up resistor 24. The gate of pass transistor 12 is connected to the source of edge-adjusting transistor 14 and to a terminal 21 of pull-up resistor 18. The source of edge-adjusting transistor 20 is connected to a terminal 27 of pull-up resistor 24 and, along with terminal 27, it is coupled for receiving a source of operating potential $V_{CC2}$. A source-to-body diode 13 is formed between the source and drain of pass transistor 12.

The source of pass transistor 12, the drain of edge-adjusting transistor 14, and terminal 19 of pull-up resistor 18 are commonly connected together and to input/output node 26 and the drain of edge-adjusting transistor 20 and terminal 25 of pull-up resistor 24 are commonly connected together and to input/output node 28.

Transceivers $30_1, 30_2, \ldots, 30_n$ are connected to logic translator 10. Each transceiver $30_1, 30_2, \ldots, 30_n$ includes input/output transistors $32_1, 32_2, \ldots, 32_n$ and input/output buffers $34_1, 34_2, \ldots, 34_n$, wherein the drains of input/output transistors $32_1, 32_2, \ldots, 32_n$ and the input terminals of input/output buffers $34_1, 34_2, \ldots, 34_n$ are connected to input/output nodes $31_1, 31_2, \ldots, 31_n$, respectively. Each transceiver $30_1, 30_2, \ldots, 30_n$ is coupled for receiving source of operating potential $V_{CC1}$. The gates of input/output transistors $32_1, 32_2, \ldots, 32_n$ are connected to control circuits $36_1, 36_2, \ldots, 36_n$, the sources of input/output transistors $32_1, 32_2, \ldots, 32_n$ are coupled for receiving a source of operating potential $V_{SS1}$, and the output terminals of input/output buffers $34_1, 34_2, \ldots, 34_n$ are connected to logic circuits $38_1, 38_2, \ldots, 38_n$, respectively. By way of example, source of operating potential $V_{SS1}$ is ground. It should be noted that for purposes of clarity, control circuits $36_1, 36_2, \ldots, 36_n$ and logic circuits $38_1, 38_2, \ldots, 38_n$ are shown in block form and that the types of control and logic circuits are known to those skilled in the art. Input/output nodes $31_1, 31_2, \ldots, 31_n$ of transceivers $30_1, 30_2, \ldots, 30_n$ are connected to input/output node 26 of logic voltage translator 10.

A transceiver 40 is connected to input/output node 28 of logic voltage translator 10. Transceiver 40 includes an input/output transistor 42 and an input/output buffer 44 wherein a drain of input/output transistor 42 and an input terminal of input/output buffer 44 are connected to input/output node 56 which in turn is connected to input/output node 28. Transceiver 40 is coupled for receiving source of operating potential $V_{CC2}$. The gate of input/output transistor 42 is connected to a control circuit 46, the source of input/output transistor 42 is coupled for receiving a source of operating potential $V_{SS2}$, and the output terminal of input/output buffer 44 is connected to a logic circuit 48. By way of example, source of operating potential $V_{SS2}$ is ground. For purposes of clarity, control circuit 46 and logic circuit 48 are shown in block form. The types of control and logic circuits are known to those skilled in the art.

Before describing the operation of logic voltage translator 10, it should be noted that for the sake of explaining its operation, supply voltage $V_{CC2}$ is assumed to be greater than supply voltage $V_{CC1}$ which is assumed to be greater than the threshold voltage of pass transistor 12. However, supply voltage $V_{CC1}$ may be greater than, less than, or equal to supply voltage $V_{CC2}$. Furthermore, the supply voltages $V_{CC1}$ for each transceiver $30_1, 30_2, \ldots, 30_n$ are the same. A logic low or logic zero voltage is transmitted to transceiver 40 by turning on one of input/output transistors $32_1, 32_2, \ldots, 32_n$ of a selected transceiver $30_1, 30_2, \ldots, 30_n$. Techniques for selecting a transceiver from a plurality of transceivers are known to those skilled in the art. Turning on one of input/output transistors $32_1, 32_2, \ldots, 32_n$ sets the voltage at the corresponding input/output node $31_1, 31_2, \ldots, 31_n$ to a logic low or a logic zero voltage level, which is transmitted to input/output node 26. The logic low voltage appearing at input/output node 26 sets the gate-to-source voltage of pass transistor 12 to be approximately equal to supply voltage $V_{CC1}$. Thus, pass transistor 12 turns on, setting the voltage at input/output node 28 equal to a logic zero voltage, e.g., equal to approximately zero volts.

Transceiver 40 transmits a logic zero voltage to the selected transceiver $30_1, 30_2, \ldots, 30_n$ by turning on input/output transistor 42, which sets the voltage at input/output node 56 to a logic low or logic zero voltage. The logic zero voltage on input/output node 56 is transmitted to input/output node 28 causing body diode 13 to become forward biased, turning on pass transistor 12 and producing a logic zero voltage at input/output node 26.

A logic high or logic one voltage is transmitted from input/output node 26 to input/output node 28 or from input/output node 28 to input/output node 26 by turning off input/output transistors $32_1, 32_2, \ldots, 32_n$ and input/output transistor 42. Turning off input/output transistors $32_1, 32_2, \ldots, 32_n$ and input/output transistor 42 sets the gate-to-source voltage of pass transistor 12 to approximately zero volts, thereby turning off pass transistor 12. Because pass transistor 12 is off, the voltages appearing at input/output nodes 26 and 28 are equal to supply voltages $V_{CC1}$ and $V_{CC2}$, respectively. A disadvantage with logic translator 10 is that a voltage $V_{CC1}$ appearing at input/output node 26 may exceed the maximum operating voltage of transceiver modules $30_1, 30_2, \ldots, 30_n$ causing an increased power consumption and eventually damaging one or more of them. Another disadvantage with logic translator 10 is that supply voltages $V_{CC1}$ for each transceiver $30_1, 30_2, \ldots, 30_n$ are the same.

Accordingly, it would be advantageous to have a structure and method for multiplexing and translating at least one of a plurality of electrical signals or demultiplexing at least one of the plurality of electrical signals. It would be of further advantage for the structure and method to be cost efficient.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
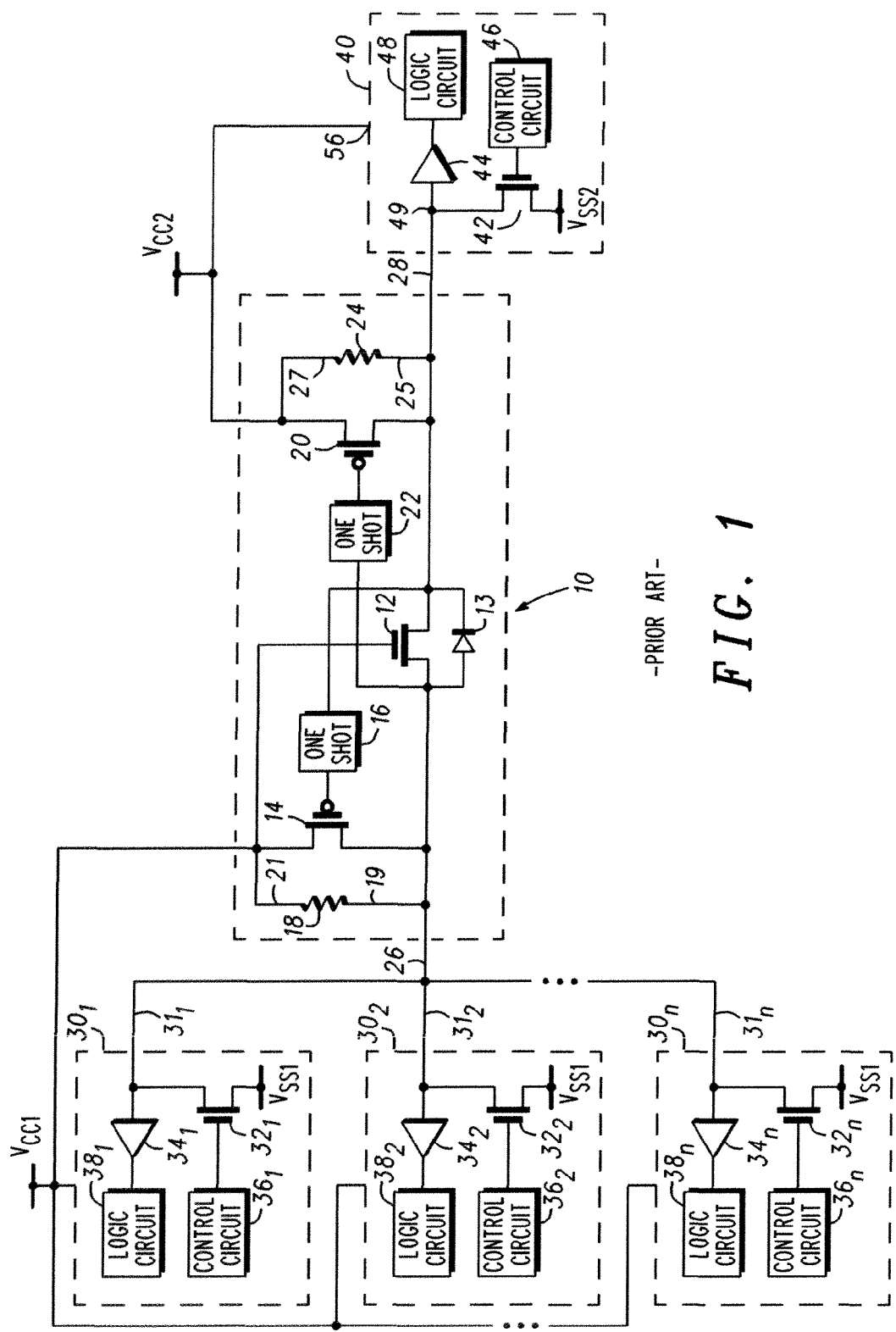
FIG. 1 is a circuit schematic of a prior art logic translator.

Generally the present invention provides a monolithically integrated bi-directional, open-drain auto sense, multiplexer-translator-demultiplexer and a method for multiplexing, translating, and demultiplexing electrical signals. In accordance with one embodiment of the present invention, the monolithically integrated multiplexer-translator-demultiplexer provides voltage level shifting that enables data transfer to systems operating at different supply voltages. More particularly, logic signals that are referenced to input voltage supplies are translated to logic signals with logic levels matched to an output voltage supply. In a similar manner, the circuit performs output to input translation by shifting input signals with logic levels referenced to the output supply voltage to a logic signal with logic levels matched to the input supply voltages. This allows voltage logic signals on an input side of a translator to be translated into voltage signals on the output side, and vice-versa. The multiplexer feature of the circuit selects one data source from a plurality of digital data input sources and provides a single channel of output signals. This allows data to be transmitted from either one of the multiple input ports to the output port or from the output port to one of the multiple input ports. In addition, the auto sense circuit enables the data channels to independently determine the direction of data flow without including a directional pin. Each data line can be configured as a uni-directional input or output data port or as a bi-directional input or output data port.

In accordance with another embodiment, a method for multiplexing and level shifting electrical signals is provided. A plurality of electrical signals is provided to a monolithically integrated circuit, which selects an electrical signal from the plurality of electrical signals. The signal level of the selected electrical signal is adjusted to form a level shifted selected electrical signal.

In accordance with another embodiment, a method for one of multiplexing and leveling shifting a first electrical signal or level shifting and demultiplexing a second electrical signal is provided. The electrical signal is multiplexed and level shifted by providing a plurality of electrical signals to a monolithically integrated circuit, using the monolithically integrated circuit to select the first electrical signal of the plurality of electrical signals; and adjusting a signal level of the selected first electrical signal to form a level shifted first electrical signal. The second electrical signal is demultiplexed by providing a second electrical signal to the monolithically integrated circuit, using the monolithically integrated circuit to adjust the signal level of the second electrical signal to form a level shifted second electrical signal, and transmitting the level shifted second electrical signal to a plurality of input/output nodes.

It should be noted that a logic zero voltage level (VOL) is also referred to as a logic low voltage and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Translator-Translator Logic (TTL) system a logic low voltage level may be about 0.8 volts, whereas for a five volt CMOS system, the logic zero voltage level may be about 1.5 volts. A logic one voltage level (VOH) is also referred to as a logic high voltage level and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

In addition, the sources and drains of a transistor are referred to as current carrying electrodes, current conducting electrodes, or current carrying terminals and the gate is referred to as a control electrode or a control terminal. A transceiver is also referred to as a transceiver circuit.

Figure 2A:
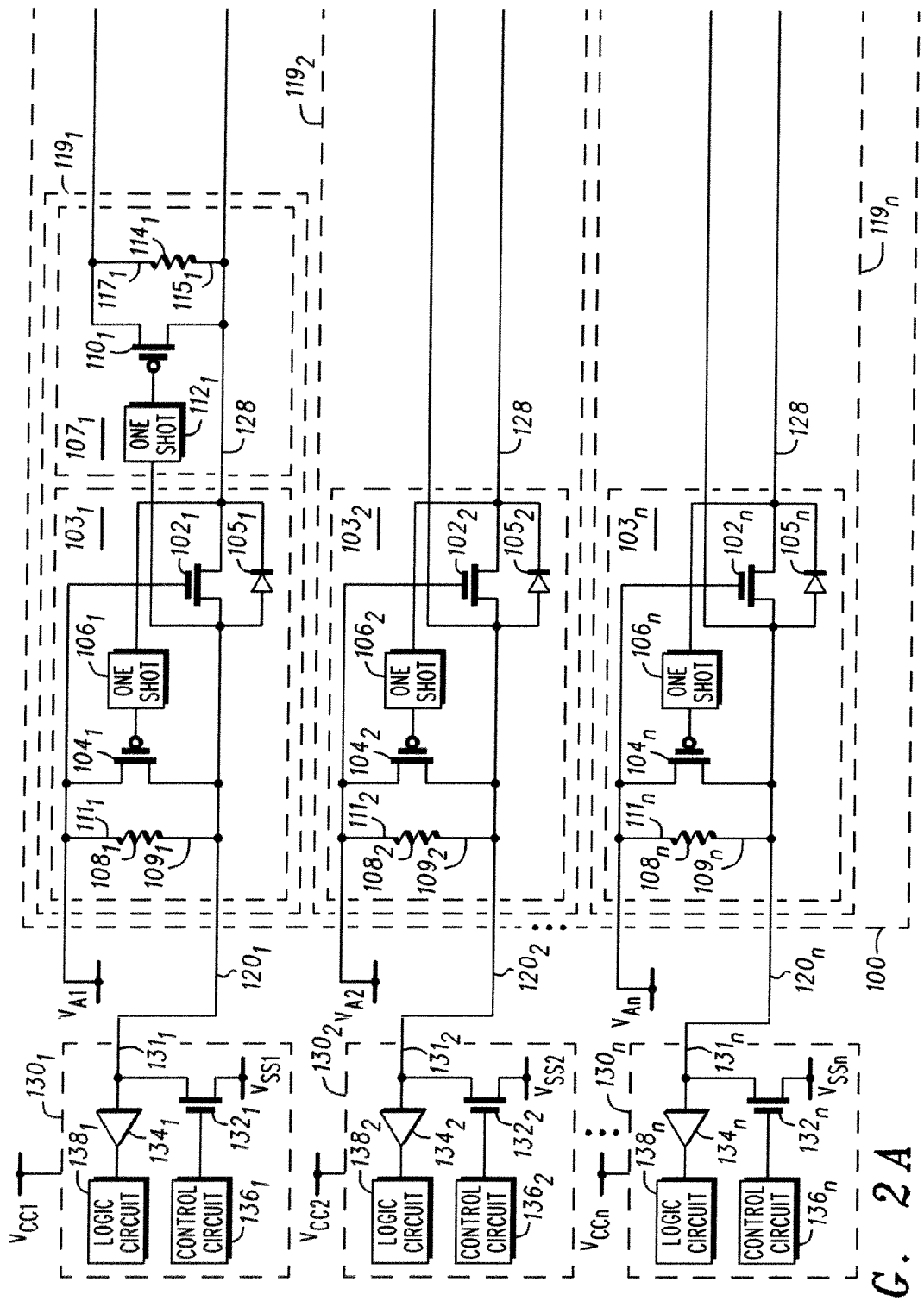
FIGS. 2A and 2B collectively are a circuit schematic of a monolithically integrated multiplexer-translator-demultiplexer in accordance with an embodiment of the present invention.
Figure 2B:
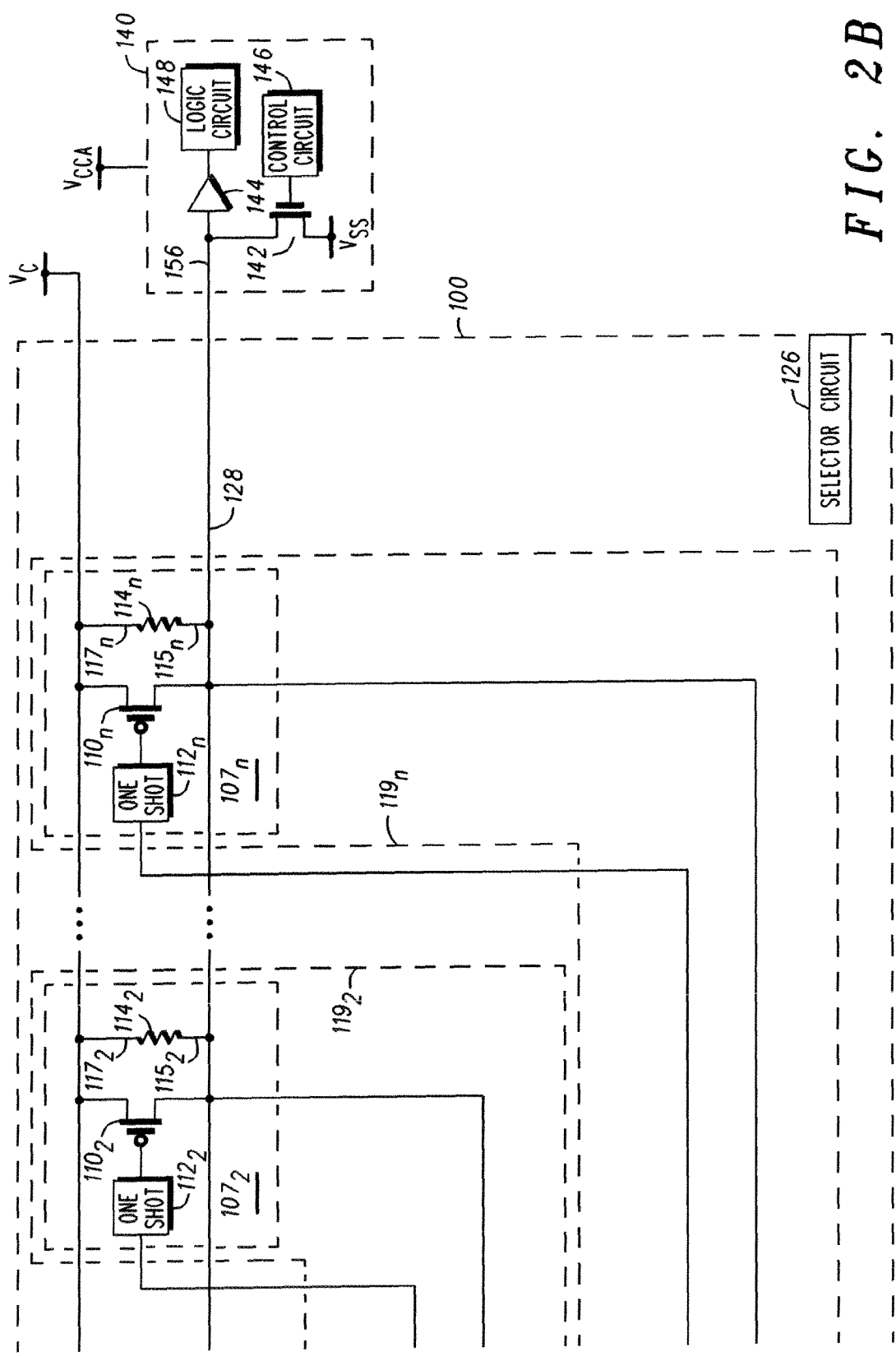

FIGS. 2A and 2B are a circuit schematic of monolithically integrated multiplexer-translator-demultiplexer 100 in accordance with an embodiment of the present invention. It should be noted that FIGS. 2A and 2B together form a circuit schematic for monolithically integrated multiplexer-translator-demultiplexer 100 and are therefore collectively referred to as FIG. 2. However, for the sake of clarity circuit schematic 100 has been shown in two figures, i.e., FIG. 2A and FIG. 2B. What is shown in FIG. 2 is an n-channel pass transistor $102_1$ coupled to p-channel edge-adjusting transistors $104_1$ and $110_1$ through corresponding one-shots $106_1$ and $112_1$, respectively. Pull-up resistors $108_1$ and $114_1$ are connected from the sources to the drains of p-channel edge-adjusting transistors $104_1$ and $110_1$, respectively. More particularly, n-channel pass transistor $102_1$ has a source connected to an input/output node $120_1$, a drain connected to input/output node 128, and a gate coupled for receiving a source of operating potential $V_{A1}$. The drain of pass transistor $102_1$ is coupled to the gate of edge-adjusting transistor $104_1$ through one-shot ("OS") $106_1$ and the source of pass transistor $102_1$ is connected to the gate of edge-adjusting transistor $110_1$ through one-shot ("OS") $112_1$. The source of pass transistor $102_1$ is also connected to a drain of edge-adjusting transistor $104_1$ and to a terminal $109_1$ of pull-up resistor $108_1$ and the drain of pass transistor $102_1$ is also connected to a drain of edge-adjusting transistor $110_1$ and to a terminal $115_1$ of pull-up resistor $114_1$. The gate of pass transistor $102_1$ is connected to the source of p-channel edge-adjusting transistor $104_1$ and to a terminal $111_1$ of pull-up resistor $108_1$. In addition, the gate of pass transistor $102_1$ is coupled for receiving source of potential $V_{A1}$. The source of edge-adjusting transistor $110_1$ is connected to a terminal $117_1$ of pull-up resistor $114_1$. Terminal $117_1$ and the source of edge-adjusting transistor $110_1$ are coupled for receiving a source of operating potential $V_C$. A source-to-body diode $105_1$ is formed from the source to the drain of pass transistor $102_1$.

The source of pass transistor $102_1$, the drain of edge-adjusting transistor $104_1$, and terminal $109_1$ of pull-up resistor $108_1$ that are commonly connected, i.e., connected together, also are connected to input/output node $120_1$ and the drain of edge-adjusting transistor $110_1$ and terminal $115_1$ of pull-up resistor $114_1$ that are commonly connected, i.e., connected together, also are connected to input/output node 128.

Transistors $102_1$ and $104_1$, body diode $105_1$, one-shot $106_1$, and pull-up resistor $108_1$ form an input stage $103_1$ of a channel $119_1$ of monolithically integrated multiplexer-translator-demultiplexer 100. Transistor $110_1$, resistor $114_1$, and one-shot $112_1$ form an output stage $107_1$ of channel $119_1$ of monolithically integrated multiplexer-translator-demultiplexer 100.

An n-channel pass transistor $102_2$ is coupled to p-channel edge-adjusting transistors $104_2$ and $110_2$ through corresponding one-shots $106_2$ and $112_2$, respectively. Pull-up resistors $108_2$ and $114_2$ are connected from the drains to the sources of p-channel edge-adjusting transistors $104_2$ and $110_2$ respectively. More particularly, n-channel pass transistor $102_2$ has a source connected to an input/output node $120_2$, a drain connected to input/output node 128, and a gate coupled for receiving a source of operating potential $V_{A2}$. The drain of pass transistor $102_2$ is coupled to the gate of edge-adjusting transistor $104_2$ through a one-shot $106_2$ and the source of pass transistor $102_2$ is connected to the gate of edge-adjusting transistor $110_2$ through a one-shot $112_2$. The source of pass transistor $102_2$ is also connected to a drain of edge-adjusting transistor $104_2$ and to a terminal $109_2$ of pull-up resistor $108_2$ and the drain of pass transistor $102_2$ is also connected to a drain of edge-adjusting transistor $110_2$ and to a terminal $115_2$ of pull-up resistor $114_2$. The gate of pass transistor $102_2$ is connected to the source of p-channel edge-adjusting transistor $104_2$ and to a terminal $111_2$ of pull-up resistor $108_2$. The source of edge-adjusting transistor $110_2$ is connected to a terminal $117_2$ of pull-up resistor $114_2$. Terminal $117_2$ and the source of edge-adjusting transistor $104_2$ are coupled for receiving source of operating potential $V_C$. A source-to-body diode $105_2$ is formed between the source and drain of pass transistor $102_2$.

The source of pass transistor $102_2$, the drain of edge-adjusting transistor $104_2$, and terminal $109_2$ of pull-up resistor $108_2$ that are commonly connected also are connected to an input/output node $120_2$ and the drain of edge-adjusting transistor $110_2$ and terminal $115_2$ of pull-up resistor $114_2$ that are commonly connected also are connected to an input/output node 128.

Transistors $102_2$ and $104_2$, body diode $105_2$, one-shot $106_2$, and pull-up resistor $108_2$ form an input stage $103_2$ of a channel $119_2$ of monolithic translator-multiplexer 100. Transistor $110_2$, pull-up resistor $114_2$, and one-shot $112_2$ form an output stage $107_2$ of channel $119_2$ of monolithic translator-multiplexer 100.

An n-channel pass transistor $102_n$ is coupled to p-channel edge-adjusting transistors $104_n$ and $110_n$ through corresponding one-shots $106_n$ and $112_n$, respectively, where n is an integer. Pull-up resistors $108_n$ and $114_n$ are connected from the sources to the drains of p-channel edge-adjusting transistors $104_n$ and $110_n$, respectively. More particularly, n-channel pass transistor $102_n$ has a source connected to an input/output node $120_n$, a drain connected to input/output node 128 and a gate coupled for receiving a source of operating potential $V_{An}$. The drain of pass transistor $102_n$ is coupled to the gate of edge-adjusting transistor $104_n$ through a one-shot $106_n$ and the source of pass transistor $102_n$ is connected to the gate of edge-adjusting transistor $110_n$ through a one-shot $112_n$. The source of pass transistor $102_n$ is connected to a drain of edge-adjusting transistor $104_n$ and to a terminal $109_n$ of pull-up resistor $108_n$ and the drain of pass transistor $102_n$ is connected to a drain of edge-adjusting transistor $110_n$ and to a terminal $115_n$ of pull-up resistor $114_n$. The gate of pass transistor $102_n$ is connected to the source of p-channel edge-adjusting transistor $104_n$ and to a terminal $111_n$ of pull-up resistor $108_n$. The source of edge-adjusting transistor $110_n$ is connected to a terminal $117_n$ of pull-up resistor $114_n$, and the source of edge-adjusting transistor $110_n$ and terminal $117_n$ are coupled for receiving source of operating potential $V_C$. A source-to-body diode $105_n$ is formed between the source and drain of pass transistor $102_n$.

The source of pass transistor $102_n$, the drain of edge-adjusting transistor $104_n$, and terminal $109_n$ of pull-up resistor $108_n$ that are commonly connected together also are connected to an input/output node $120_n$ and the drain of edge-adjusting transistor $110_n$ and terminal $115_n$ of pull-up resistor $114_n$ that are commonly connected together also are connected to input/output node 128. The sources of edge-adjusting transistors $102_1$, $110_2$, ..., $110_n$ and terminals $117_1$, $117_2$, ..., $117_n$ of pull-up resistors $114_1$, $114_2$, ..., $114_n$ are commonly connected together.

Transistors $102_n$ and $104_n$, body diode $105_n$, one-shot $106_n$, and pull-up resistor $108_n$ form an input stage $103_n$ of a channel $119_n$ of monolithically integrated multiplexer-translator-demultiplexer 100 and transistor $110_n$, pull-up resistor $114_n$, and one-shot $112_n$ form an output stage $107_n$ of channel $119_n$ of monolithically integrated multiplexer-translator-demultiplexer 100.

Transceivers $130_1$, $130_2$, ..., $130_n$ are connected to input/output nodes $120_1$, $120_2$, ..., $120_n$, of channels $119_1$, $119_2$, ..., $119_n$, respectively. Each transceiver $130_1$, $130_2$, ..., $130_n$ includes input/output transistors $132_1$, $132_2$, ..., $132_n$ and input/output buffers $134_1$, $134_2$, ..., $134_n$, wherein the drains of input/output transistors $132_1$, $132_2$, ..., $132_n$ and the input terminals of buffers $134_1$, $134_2$, ..., $134_n$ are connected to input/output nodes $131_1$, $131_2$, ..., $131_n$, respectively. Each transceiver $130_1$, $130_2$, ..., $130_n$ is coupled for receiving sources of operating potential or supply voltages $V_{CC1}$, $V_{CC2}$, ..., $V_{CCn}$, respectively. It should be noted that the voltages of supply voltages $V_{CC1}$, $V_{CC2}$, ..., $V_{CCn}$ may be the same or different. The gates of input/output transistors $132_1$, $132_2$, ..., $132_n$ are connected to control circuits $136_1$, $136_2$, ..., $136_n$, the sources of input/output transistors $132_1$, $132_2$, ..., $132_n$ are coupled for receiving sources of operating potential or supply voltages $V_{SS1}$, $V_{SS2}$, ..., $V_{SSn}$, and the output terminals of input/output buffers $134_1$, $134_2$, ..., $134_n$ are connected to logic circuits $138_1$, $138_2$, ..., $138_n$, respectively. It should be noted that for the purposes of clarity, control circuits $134_1$, $134_2$, ..., $134_n$ and logic circuits $138_1$, $138_2$, ..., $138_n$ are shown in block form and that the types of control and logic circuits are known to those skilled in the art. Input/output nodes $131_1$, $131_2$, ..., $131_n$ of transceivers $130_1$, $130_2$, ..., $130_n$ are connected to input/output nodes $120_1$, $120_2$, ..., $120_n$, respectively.

A transceiver 140 is connected to input/output node 128. Transceiver 140 includes an input/output transistor 142 and an input/output buffer 144 wherein a drain of input/output transistor 142 and an input terminal of input/output buffer 144 are connected to input/output node 156 which is connected to input/output node 128. Transceiver 140 is coupled for receiving source of operating potential $V_{CCA}$. The gate of input/output transistor 142 is connected to a control circuit 146, the source of input/output transistor 142 is coupled for receiving a source of operating potential $V_{SS}$, and the output terminal of input/output buffer 144 is connected to a logic circuit 148. It should be noted that for the purposes of clarity, control circuit 146 and logic circuit 148 are shown in block form and that the types of control and logic circuits are known to those skilled in the art.

In operation, an address is placed on an address node by selector circuit 126 to activate the desired transceiver and deactivate the other transceivers of the plurality of transceivers $130_1$, $130_2$, ..., $130_n$. For example, it may be desirable to transmit a logic zero voltage from transceiver $130_1$ to transceiver 140. Thus, the address for transceiver $130_1$ is placed on address node 126 to activate it and deactivate transceivers $130_2$-$130_n$. Control circuit $134_1$ turns on input/output transistor $132_1$ causing the voltage at input/output node $131_1$ to be equal to a logic zero voltage level, which is transmitted to input/output node $120_1$, thereby setting the voltage at the source of pass transistor $102_1$ at a logic zero level. The gate-to-source voltage of pass transistor $102_1$ is approximately equal to supply voltage $V_{A1}$, which turns on pass transistor $102_1$ and sets the voltage at input/output node 128 equal to approximately zero volts. It should be noted that pass transistor $102_1$ turns on as long as voltage $V_{A1}$ is greater than the threshold voltage of transistor $102_1$.

Transceiver 140 transmits a logic zero voltage to selected transceiver $130_1$ by turning on input/output transistor 142, which sets the voltage at input/output node 146 to a logic low or logic zero voltage. The logic zero voltage on input/output node 146 is transmitted to input/output node 128 causing source-to-drain body diode $105_1$ to become forward biased and the gate-to-source voltage of pass transistor $102_1$ to be equal to voltage $V_{A1}$ minus the voltage drop of body diode $105_1$. If the gate-to-source voltage of pass transistor $102_1$ is greater than the threshold voltage of pass transistor $102_1$, pass transistor $102_1$ turns on and pulls down the voltage at input/output node $120_1$ to a logic zero voltage level. The logic zero voltage is transmitted to transceiver $130_1$ through input/output node $131_1$.

For selected transceiver $130_1$, a logic high or logic one voltage is transmitted from transceiver $130_1$ to transceiver 140 or from transceiver 140 to transceiver $130_1$ by turning off input/output transistors $132_1$ and 142. More particularly, the logic high voltage is transmitted from input/output node $120_1$ to input/output node 128 or from input/output node 128 to input/output node $120_1$ by turning off input/output transistors $132_1$ and 142. Turning off input/output transistors $132_1$ and 142 sets the gate-to-source voltage of pass transistor $102_1$ to approximately zero volts, thereby turning off pass transistor $102_1$. Because pass transistor $102_1$ is off, the voltages appearing at input/output nodes $120_1$ and 128 are equal to supply voltages $V_{A1}$ and $V_C$, respectively.

Alternatively, it may be desirable to transmit a logic low or logic zero voltage from transceiver $130_n$ to transceiver 140. Thus, the address for transceiver $130_n$ is placed on the address node by selector circuit 126 to activate it and deactivate transceivers $130_1$-$130_{n-1}$. Control circuit $134_n$ turns on input/output transistor $132_n$ causing the voltage at input/output node $131_n$ to be equal to a logic zero voltage, e.g., approximately zero volts. The logic zero voltage is transmitted to input/output node $120_n$, thereby setting the voltage at the source of pass transistor $102_n$ to be approximately zero volts. Thus, the gate-to-source voltage of pass transistor $102_n$ is approximately equal to supply voltage $V_{An}$, which turns on pass transistor $102_n$ and sets the voltage at input/output node 128 equal to approximately zero volts. It should be noted that pass transistor $102_n$ turns on as long as voltage $V_{An}$ is greater than the threshold voltage of transistor $102_n$.

Transceiver 140 transmits a logic zero voltage to selected transceiver $130_n$ by turning on input/output transistor 142, which sets the voltage at input/output node 156 to a logic low or logic zero voltage. The logic zero voltage on input/output node 156 is transmitted to input/output node 128 causing source-to-drain body diode $105_n$ to become forward biased and the gate-to-source voltage of pass transistor $102_n$ to be equal to voltage $V_{An}$ minus the voltage drop of body diode $105_n$. If the gate-to-source voltage of pass transistor $102_n$ is greater than the threshold voltage of pass transistor $102_n$, pass transistor $102_n$ turns on and pulls down the voltage at input/output node $120_n$ to a logic zero voltage level. The logic zero voltage is transmitted to transceiver $130_n$ through input/output node $131_n$.

For selected transceiver $130_n$, a logic high or logic one voltage is transmitted from input/output node $120_n$ to input/ output node 128 or from input/output node 128 to input/output node $120_n$ by turning off input/output transistors $132_n$ and 142. Turning off input/output transistors $132_n$ and 142 sets the gate-to-source voltage of pass transistor $102_n$ to approximately zero volts, thereby turning off pass transistor $102_n$. Because pass transistor $102_n$ is off, the voltages appearing at input/output nodes $120_n$ and 128 are equal to supply voltages $V_{An}$ and $V_C$, respectively.

Figure 3A:
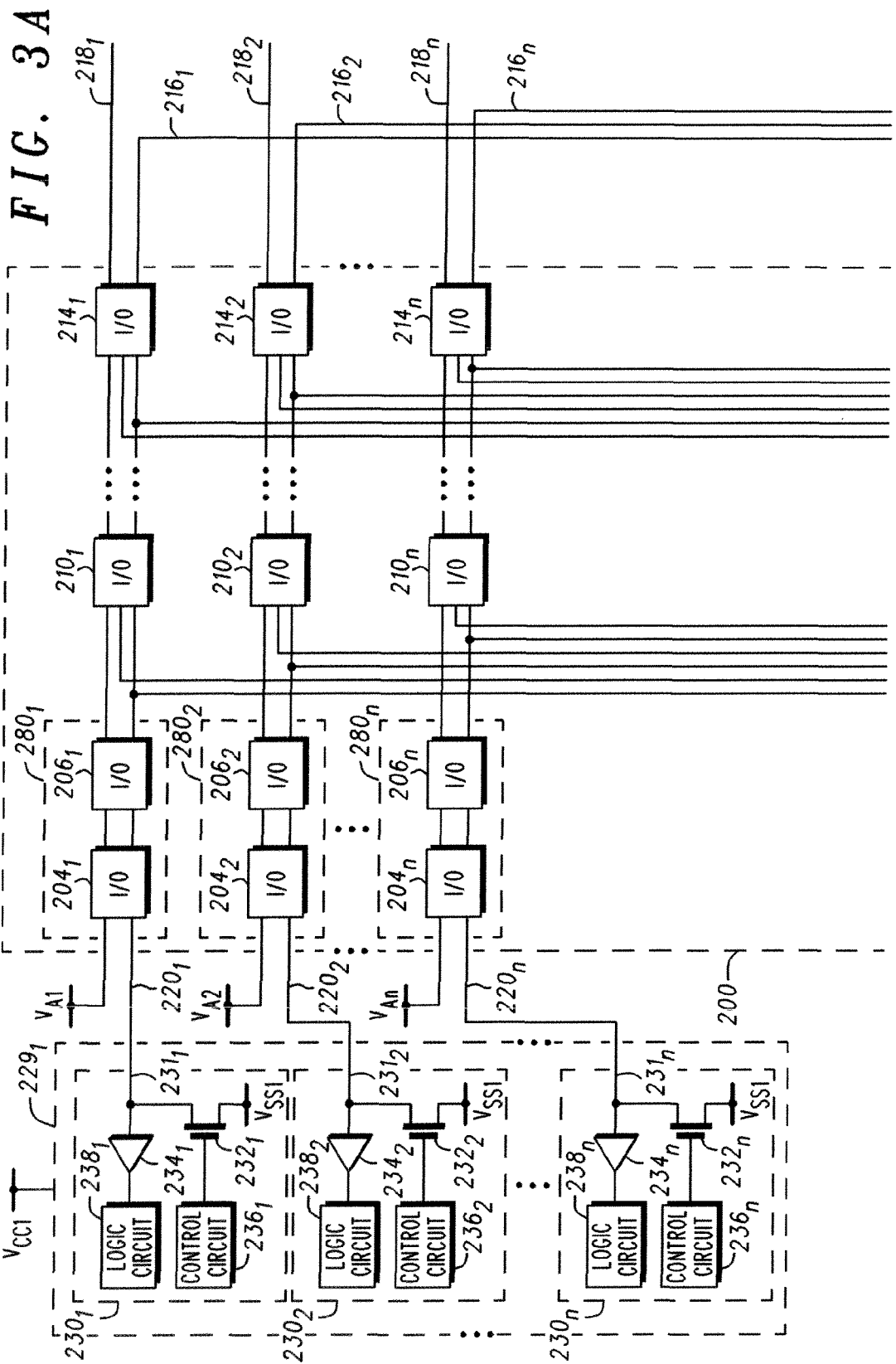
FIGS. 3A, 3B, 3C, and 3D collectively are a block diagram of a monolithically integrated multiplexer-translator-demultiplexer in accordance with another embodiment of the present invention.
Figure 3B:
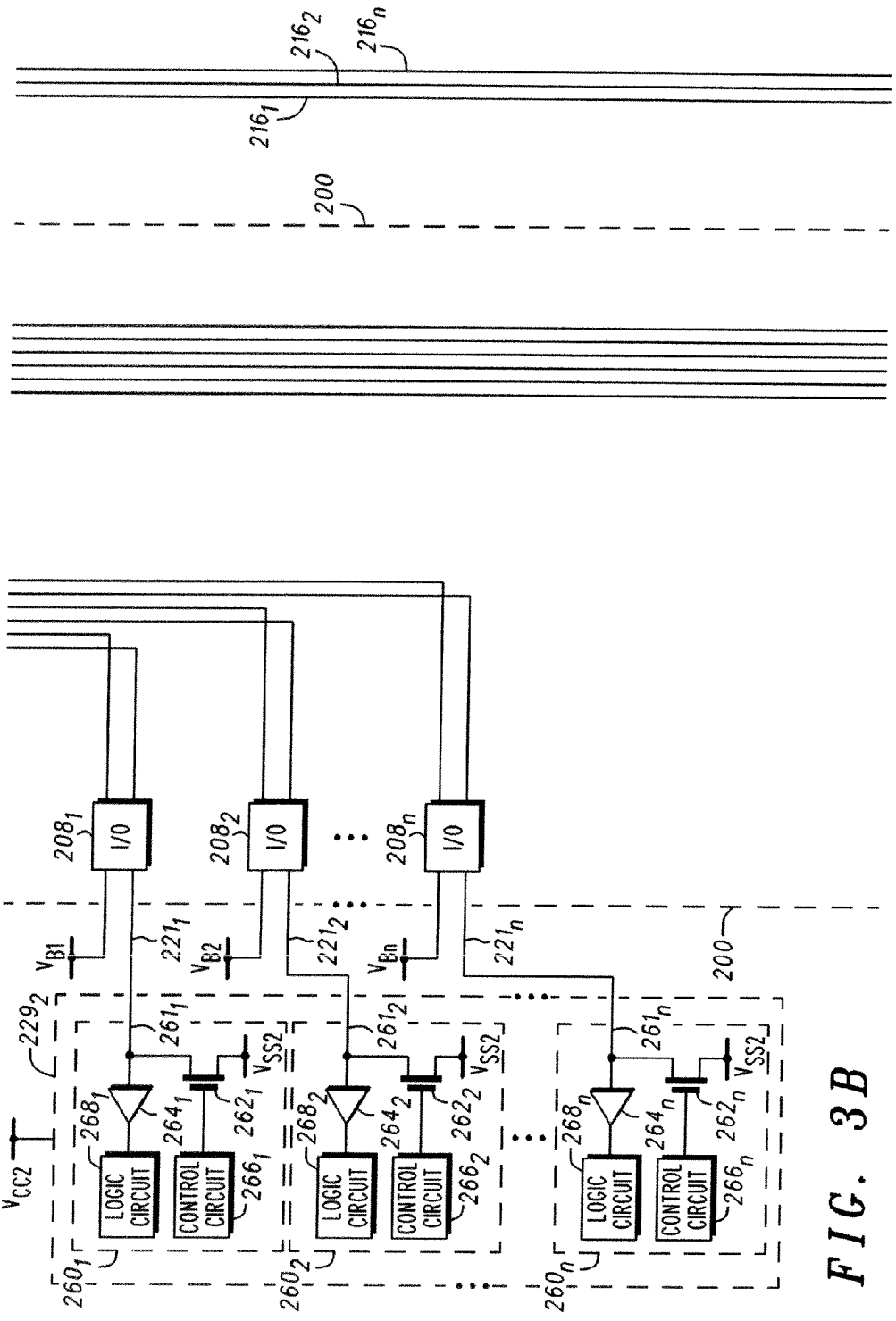
Figure 3C:
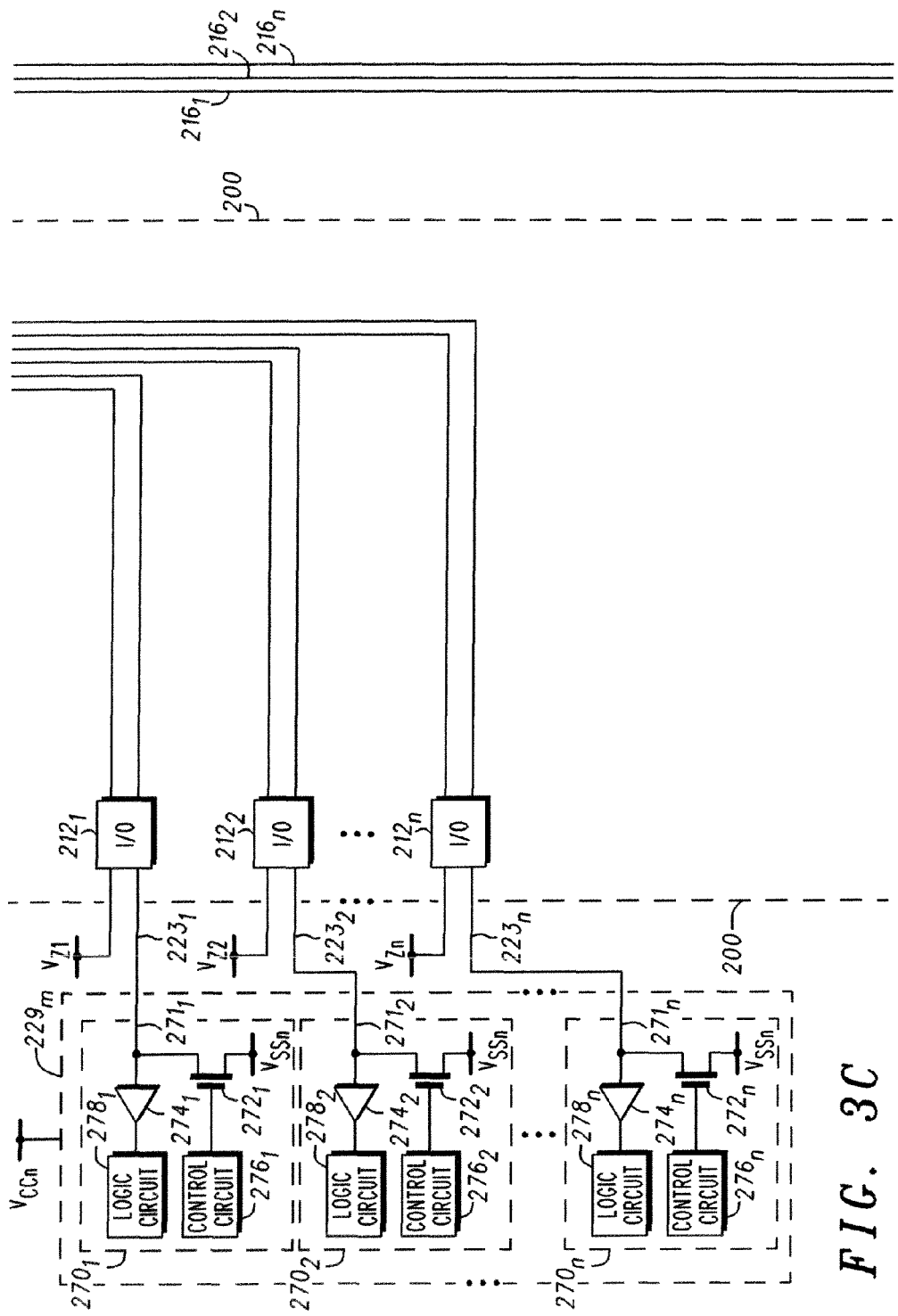
Figure 3D:
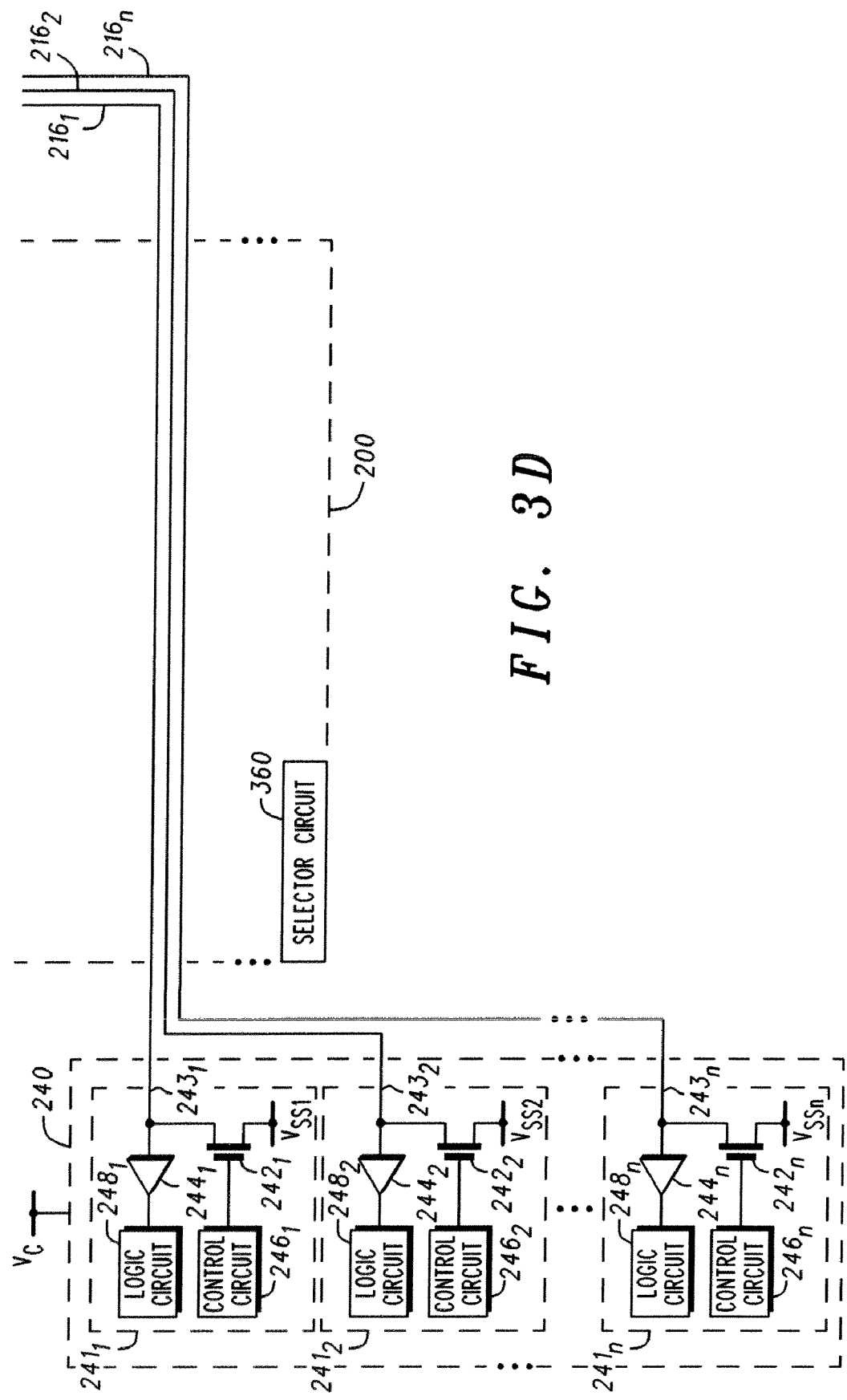
Figure 4:
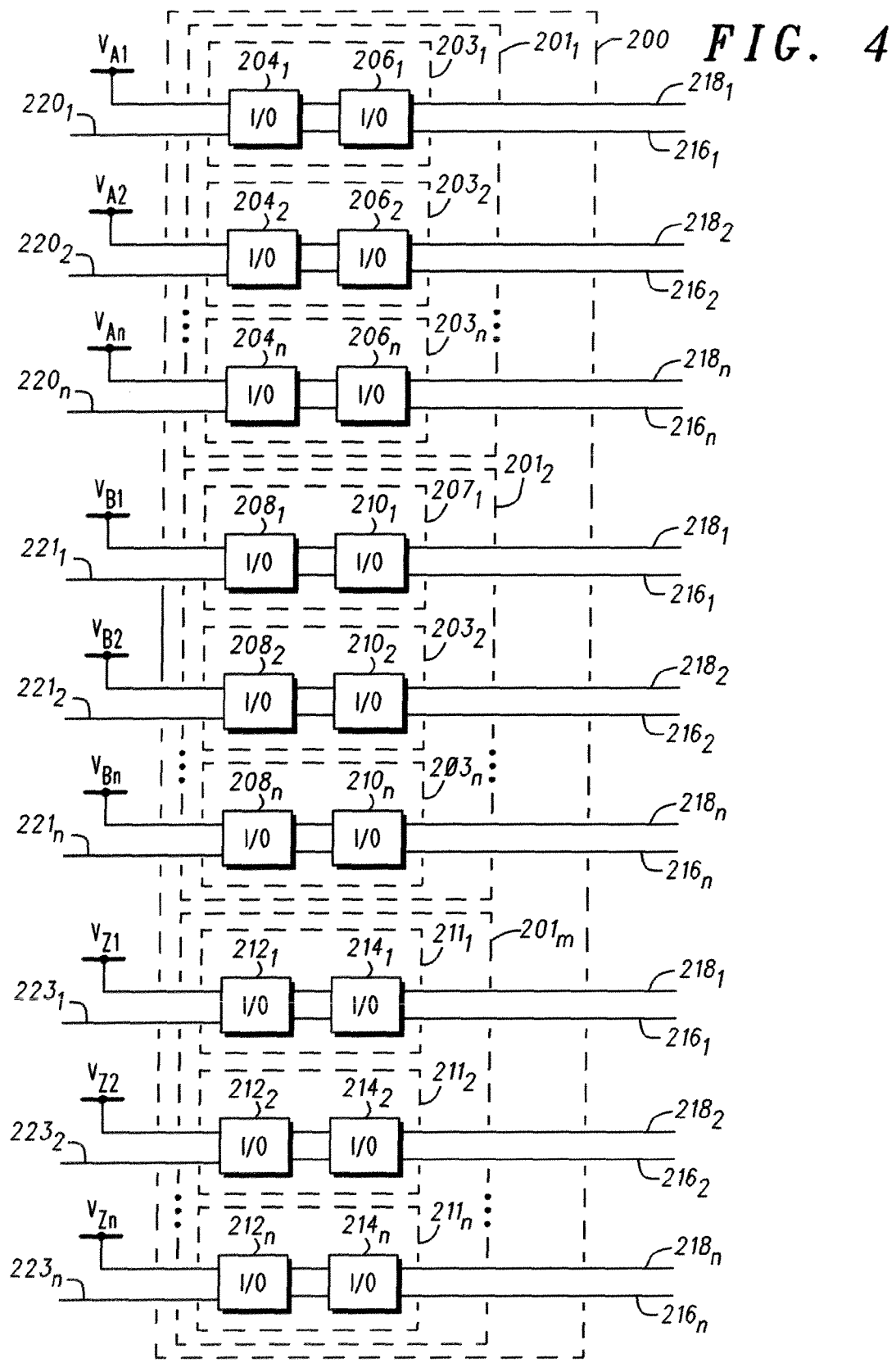
FIG. 4 is another block diagram of the monolithically integrated multiplexer-translator-demultiplexer of FIG. 3.

FIGS. 3A, 3B, 3C, 3D and 4 are block diagrams of a monolithically integrated multiplexer-translator-demultiplexer 200 in accordance with another embodiment of the present invention. It should be noted that FIGS. 3A, 3B, 3C, and 3D together form a circuit schematic for monolithically integrated multiplexer-translator-demultiplexer 200 and are therefore collectively referred to as FIG. 3. However, for the sake of clarity circuit schematic 200 has been shown in four figures, i.e., FIG. 3A, 3B, 3C, and FIG. 3D. It should be noted that FIGS. 3 and 4 are described together and that FIG. 4 is included to more clearly illustrate that monolithically integrated multiplexer-translator-demultiplexer 200 comprises input/output sections $201_1$, $201_2$, ..., $201_m$, where m is an integer. Input/output section $201_1$ includes monolithically integrated multiplexer-translator-demultiplexer structures $203_1$, $203_2$, ..., $203_n$, input/output section $201_2$ includes monolithically integrated multiplexer-translator-demultiplexer sections $207_1$, $207_2$, ..., $207_n$, and input/output section $201_m$ includes monolithically integrated multiplexer-translator-demultiplexer sections $211_1$, $211_2$, ... $211_n$, respectively, where m is an integer that may be equal to m.

FIG. 4 further illustrates that monolithically integrated multiplexer-translator-demultiplexer structures $203_1$, $203_2$, ..., $203_n$ include a set of input/output structures $204_1$, $204_2$, ..., $204_n$ coupled to a corresponding set of input/output structures $206_1$, $206_2$, ..., $206_n$, respectively; monolithically integrated multiplexer-translator-demultiplexer structures $207_1$, $207_2$, ..., $207_n$ comprise a set of input/output structures $208_1$, $208_2$, ..., $208_n$ coupled to a corresponding set of input/output structures $210_1$, $210_2$, ..., $210_n$, respectively; and monolithically integrated multiplexer-translator-demultiplexer structures $211_1$, $211_2$, ..., $211_n$ comprise a set of input/output structures $212_1$, $212_2$, ..., $212_n$ coupled to a corresponding set of input/output structures $214_1$, $214_2$, ..., $214_n$, respectively. It should be noted that input/output node $216_1$ is common to input/output structures $206_1$, $210_1$, ..., $214_1$, input/output node $216_2$ is common to input/output structures $206_2$, $210_2$, ..., $214_2$, and input/output node $216_n$ is common to input/output structures $206_n$, $210_n$, ..., $214_n$, and that input/output node $218_1$ is common to input/output structures $206_1$, $210_1$, ..., $214_1$, input output/node $218_2$ is common to input/output structures $206_2$, $210_2$, ..., $214_2$, and input/output node $218_n$ is common to input/output structures $206_n$, $210_n$, ..., $214_n$. For the sake of clarity, these common connections are not shown in FIG. 4, but are shown in FIG. 3. Thus, FIGS. 3 and 4 and their descriptions should be viewed together.

Monolithically integrated multiplexer-translator-demultiplexer structures $203_1$, $203_2$, ..., $203_n$ comprising input/output stages $204_1$-$204_n$ coupled to input/output stages $206_1$-$206_n$, respectively, are also referred to as bidirectional data transmission stages, transmission channels, conduction channels, or data channels; monolithically integrated multiplexer-translator-demultiplexer structures $207_1$, $207_2$, ..., $207_n$ comprising input/output stages $208_1$-$208_n$ coupled to input/output channels $210_1$-$210_n$, respectively, are also referred to as bidirectional data transmission stages, conduction channels, or transmission channels; and monolithically integrated multiplexer-translator-demultiplexer structures $211_1$, $211_2$, ..., $211_n$ comprising input/output stages $212_1$-$212_n$ coupled to input/output stages $214_1$-$214_n$, respectively, are also referred to as bidirectional data transmission stages, transmission channels, conduction channels, or data channels.

FIG. 3 further illustrates an input/output node of input/output structure $208_1$ connected to an input/output node of input/output structure $206_1$ and to an input/output node of input/output structure $210_1$ and an output terminal of input/output structure $208_1$ connected to an input terminal of input/output structure $210_1$. Still referring to FIG. 3, an input/output node of input/output structure $208_2$ is connected to an input/output node of input/output structure $206_2$ and to an input/output node of input/output structure $210_2$ and an output terminal of input/output structure $208_2$ is connected to an input terminal of input/output structure $210_2$. An input/output node of input/output structure $208_n$ is connected to an input/output node of input/output structure $206_n$ and to an input/output node of input/output structure $210_n$ and an output terminal of input/output structure $208_n$ is connected to an input terminal of input/output structure $210_n$. An input/output node of input/output structure $212_1$ is coupled to an input/output node of input/output structure $210_1$ and connected to an input/output node of input/output structure $214_1$ and an output terminal of input/output structure $212_1$ is connected to an input terminal of input/output structure $214_1$. An input/output node of input/output structure $212_2$ is coupled to an input/output node of input/output structure $210_2$ and connected to an input/output node of input/output structure $214_2$ and an output terminal of input/output structure $212_2$ is connected to an input terminal of input/output structure $214_2$. An input/output node of input/output structure $212_n$ is coupled to an input/output node of input/output structure $210_n$ and connected to an input/output node of input/output structure $214_n$ and an output terminal of input/output structure $212_n$ is connected to an input terminal of input/output structure $214_n$.

Input/output structures $204_1$, $204_2$, ..., $204_n$ are coupled for receiving voltages $V_{A1}$, $V_{A2}$, ..., $V_{An}$, input/output structures $208_1$, $208_2$, ..., $208_n$ are coupled for receiving voltages $V_{B1}$, $V_{B2}$, ..., $V_{Bn}$, and input/output structures $212_1$, $212_2$, ..., $212_n$ are coupled for receiving voltages $V_{Z1}$, $V_{Z2}$, ..., $V_{Zn}$, respectively.

A transceiver circuit $229_1$ is coupled to monolithically integrated multiplexer-translator-demultiplexer 200. Transceiver circuit $229_1$ includes transceiver sections or elements $230_1$, $230_2$, ..., $230_n$ that are connected to input/output nodes $220_1$, $220_2$, ..., $220_n$, of channels $203_1$, $203_2$, ..., $203_n$, respectively. Each transceiver element $230_1$, $230_2$, ..., $230_n$ includes input/output transistors $232_1$, $232_2$, ..., $232_n$ and input/output buffers $234_1$, $234_2$, ..., $234_n$, wherein the drains of input/output transistors $232_1$, $232_2$, ..., $232_n$ and the input terminals of buffers $234_1$, $234_2$, ... $234_n$ are connected to input/output nodes $231_1$, $231_2$, ... $231_n$, respectively. Each transceiver element $230_1$, $230_2$, ..., $230_n$ is coupled for receiving a source of operating potential or supply voltages $V_{CC1}$. The gates of input/output transistors $232_1$, $232_2$, ..., $232_n$ are connected to control circuits $236_1$, $236_2$, ..., $236_n$, the sources of input/output transistors $232_1$, $232_2$, ..., $232_n$ are coupled for receiving a source of operating potential or supply voltage $V_{SS1}$, and the output terminals of input/output buffers $234_1$, $234_2$, ..., $234_n$ are connected to logic circuits $238_1$, $238_2$, ..., $238_n$, respectively. It should be noted that for the purposes of clarity, control circuits $236_1$, $236_2$, ..., $236_n$ and logic circuits $238_1$, $238_2$, ..., $238_n$ are shown in block form and that the types of control and logic circuits are known to those skilled in the art. Input/output nodes $231_1$, $231_2$, ...

$231_n$ of transceiver elements $230_1, 230_2, \ldots, 230_n$ are connected to input/output nodes $220_1, 220_2, \ldots, 220_n$, respectively.

A transceiver circuit $229_2$ is coupled to monolithically integrated multiplexer-translator-demultiplexer 200. Transceiver circuit $229_2$ has transceiver sections or elements $260_1, 260_2, \ldots, 260_n$ that are connected to input/output nodes $221_1, 221_2, \ldots, 221_n$, of channels $207_1, 207_2, \ldots, 207_n$, respectively. Each transceiver element $260_1, 260_2, \ldots, 260_n$ includes input/output transistors $262_1, 262_2, \ldots, 262_n$ and input/output buffers $264_1, 264_2, \ldots, 264_n$, wherein the drains of input/output transistors $262_1, 262_2, \ldots, 262_n$ and the input terminals of buffers $264_1, 264_2, \ldots, 264_n$ are connected to input/output nodes $261_1, 261_2, \ldots, 261_n$, respectively. Each transceiver element $260_1, 260_2, \ldots, 260_n$ is coupled for receiving a source of operating potential or supply voltages $V_{CC2}$. The gates of input/output transistors $262_1, 262_2, \ldots, 262_n$ are connected to control circuits $266_1, 266_2, \ldots, 266_n$, the sources of input/output transistors $262_1, 262_2, \ldots, 262_n$ are coupled for receiving a source of operating potential or supply voltage $V_{SS2}$ and the output terminals of input/output buffers $264_1, 264_2, \ldots, 264_n$ are connected to logic circuits $268_1, 268_2, \ldots, 268_n$, respectively. For purposes of clarity, control circuits $264_1, 264_2, \ldots, 264_n$ and logic circuits $268_1, 268_2, \ldots, 268_n$ are shown in block form and that the types of control and logic circuits are known to those skilled in the art. Input/output nodes $261_1, 261_2, \ldots, 261_n$ of transceiver elements $260_1, 260_2, \ldots, 260_n$ are connected to input/output nodes $221_1, 221_2, \ldots, 221_n$, respectively, of monolithically integrated multiplexer-translator-demultiplexer 200.

A transceiver circuit $229_m$ is coupled to monolithically integrated multiplexer-translator-demultiplexer 200. Transceiver circuit $229_m$ has transceiver sections or elements $270_1, 270_2, \ldots, 270_n$ that are connected to input/output nodes $223_1, 223_2, \ldots, 223_n$, of channels $211_1, 211_2, \ldots, 211_n$, respectively. Each transceiver element $270_1, 270_2, \ldots, 270_n$ includes input/output transistors $272_1, 272_2, \ldots, 272_n$ and input/output buffers $274_1, 274_2, \ldots, 274_n$, wherein the drains of input/output transistors $272_1, 272_2, \ldots, 272_n$ and input terminals of buffers $274_1, 274_2, \ldots, 274_n$ are connected to input/output nodes $271_1, 271_2, \ldots, 271_n$, respectively. Each transceiver element $270_1, 270_2, \ldots, 270_n$ is coupled for receiving a source of operating potential or supply voltages $V_{CCn}$. The gates of input/output transistors $272_1, 272_2, \ldots, 272_n$ are connected to control circuits $276_1, 276_2, \ldots, 276_n$, the sources of input/output transistors $272_1, 272_2, \ldots, 272_n$ are coupled for receiving sources of operating potential or supply voltages $V_{SSn}$ and the output terminals of input/output buffers $274_1, 274_2, \ldots, 274_n$ are connected to logic circuits $278_1, 278_2, \ldots, 278_n$, respectively. It should be noted that for the purposes of clarity, control circuits $276_1, 276_2, \ldots, 276_n$ and logic circuits $278_1, 278_2, \ldots, 278_n$ are shown in block form and that the types of control and logic circuits are known to those skilled in the art. Input/output nodes $271_1, 271_2, \ldots, 271_n$ of transceiver elements $270_1, 270_2, \ldots, 270_n$ are connected to input/output nodes $223_1, 223_2, \ldots, 223_n$, respectively, of monolithically integrated multiplexer-translator-demultiplexer 200. It should be noted that supply voltages $V_{CC1}, V_{CC2}, \ldots, V_{CCn}$ may be the same or different. Likewise voltages $V_{SS1}, V_{SS2}, \ldots, V_{SSn}$ may be the same or different.

A transceiver circuit 240 having input/output nodes $243_1, 243_2, \ldots, 243_n$ are connected to input/output nodes $216_1, 216_2, \ldots, 216_n$, of channels $203_1, 203_2, \ldots, 203_n$, respectively. Transceiver circuit 240 comprises transceiver sections or elements $241_1, 241_2, \ldots, 241_n$ which include input/output transistors $242_1, 242_2, \ldots, 242_n$ and input/output buffers $244_1, 244_2, \ldots, 244_n$, wherein the drains of input/output transistors $242_1, 242_2, \ldots, 242_n$ and the input terminals of buffers $244_1, 244_2, \ldots, 244_n$ are connected to input/output nodes $243_1, 243_2, \ldots, 243_n$, respectively. Each transceiver section $241_1, 241_2, \ldots, 241_n$ is coupled for receiving a source of operating potential or supply voltages $V_C$. The gates of input/output transistors $242_1, 242_2, \ldots, 242_n$ are connected to control circuits $246_1, 246_2, \ldots, 246_n$, the sources of input/output transistors $242_1, 242_2, \ldots, 242_n$ are coupled for receiving sources of operating potential or supply voltages $V_{SS}$ and the output terminals of input/output buffers $244_1, 244_2, \ldots, 244_n$ are connected to logic circuits $248_1, 248_2, \ldots, 248_n$, respectively. It should be noted that for the purposes of clarity, control circuits $246_1, 246_2, \ldots, 246_n$ and logic circuits $248_1, 248_2, \ldots, 248_n$ are shown in block form and that the types of control and logic circuits are known to those skilled in the art. Input/output nodes $243_1, 243_2, \ldots, 243_n$ of transceiver circuit 240 are connected to input/output nodes $216_1, 216_2, \ldots, 216_n$, of channels $203_1, 203_2, \ldots, 203_n$, respectively.

By way of example, transceiver circuits $229_1, 229_2$, and 240 are SDIO systems. Alternatively, transceiver circuits $229_1, 229_2$, and 240 are MMC's. In accordance with other alternative embodiments, transceiver circuit $229_1$ is an SDIO system and transceiver circuit 240 is an MMC, or transceiver circuit $229_1$ is an MMC and transceiver circuit 240 is an SDIO system or transceiver circuits $229_1$ and $229_2$, are SDIO systems and transceiver circuit 240 is an MMC, etc.

Figure 5:
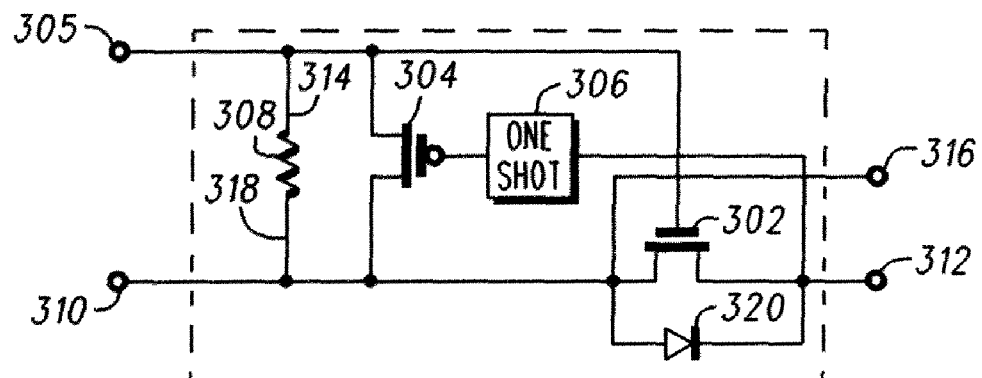
FIG. 5 is a circuit schematic of a portion of an input/output stage of the monolithically integrated multiplexer-translator-demultiplexer of FIG. 4.

Referring now to FIG. 5, each input/output structure $204_1$-$204_n, 208_1$-$208_n$, and $212_1$-$212_n$ comprises an n-channel pass transistor 302 coupled to a p-channel edge-adjusting transistor 304 through a one-shot 306 and a pull-up resistor 308 connected from the source to the drain of p-channel edge-adjusting transistor 304. More particularly, n-channel pass transistor 302 has a source connected to an input/output node 310, a drain connected to an output node 316, and a gate connected to an input/output node 305. The drain of pass transistor 302 is coupled to the gate of edge-adjusting transistor 304 through one-shot 306 and to an output node 312. The gate of pass transistor 302 is connected to the source of p-channel edge-adjusting transistor 304 and to a terminal 314 of pull-up resistor 308. In addition, the gate of pass transistor 302 is connected to output node 305. The source of pass transistor 302 is also connected to a drain of edge-adjusting transistor 304 and to a terminal 318 of pull-up resistor 308. A source-to-body diode 320 is formed between the source and drain of pass transistor 302.

Figure 6:
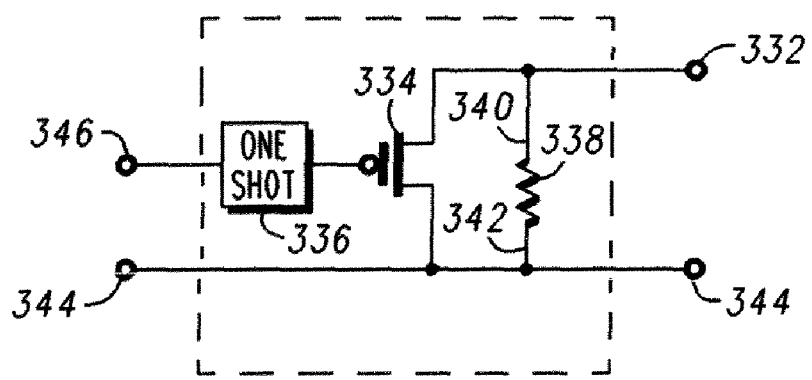
FIG. 6 is a circuit schematic of a portion of another input/output stage of the monolithically integrated multiplexer-translator-demultiplexer of FIG. 4.

Referring now to FIG. 6, each input/output structure $206_1$-$206_n, 210_1$-$210_n$, and $214_1$-$214_n$ comprises a one-shot 336 connected to a p-channel edge-adjusting transistor 334 and a pull-up resistor 338 connected from the source to the drain of p-channel edge-adjusting transistor 334. The source of edge-adjusting transistor 334 is connected to a terminal 340 of pull-up resistor 338 and to an input/output node 332. The drain of p-channel edge-adjusting transistor 334 is connected to a terminal 342 of pull-up resistor 338 and to an input/output node 344. An input of one-shot 336 is connected to an input node 346.

When input/output structures $204_1$-$204_n$ are connected to corresponding input/output structures $206_1$-$206_n, 210_1$-$210_n$, and $214_1$-$214_n$ (as shown in FIGS. 3 and 4), output nodes 316 are connected to input nodes 346 and input/output nodes 312 are connected to input/output nodes 344. Thus, the sources of pass transistors 302 are connected to the inputs of one-shots 336, the drains of pass transistor 302 and edge-adjusting transistors 334 are electrically connected to each other, and the sources of edge adjusting transistors 334 and terminals 340 of pull-up resistors 338 are electrically connected to each other. Thus, the source of pass transistor 302, the drain of edge-adjusting transistor 304, and terminal 318 of resistor 308 that are commonly connected, i.e., connected together, also are connected to an input/output node 310 and the drain of edge-adjusting transistor 334 and terminal 342 of resistor 338 that are commonly connected, i.e., connected together, also are connected to an input/output node 344.

In operation, a selector circuit such as selector circuit 360 shown in FIG. 3D selects between transceiver circuits $229_1$, $229_2$, $229_m$, for transmitting data to transceiver 140 or receiving data from transceiver 240. In other words, selector circuit 360 selects from one of the sets of transceiver elements $230_1$-$230_n$, $262_1$-$262_n$, $270_1$-$270_n$ for transmitting data to transceiver 240 or receiving data from transceiver 240. The operation of transferring data to and from the selected transceiver circuit of the set of transceiver circuits $229_1$-$229_m$ is similar to that described for transceivers $130_1$, $130_2$, ..., $130_n$ and transceiver 140 with reference to FIG. 2.

Figure 7:
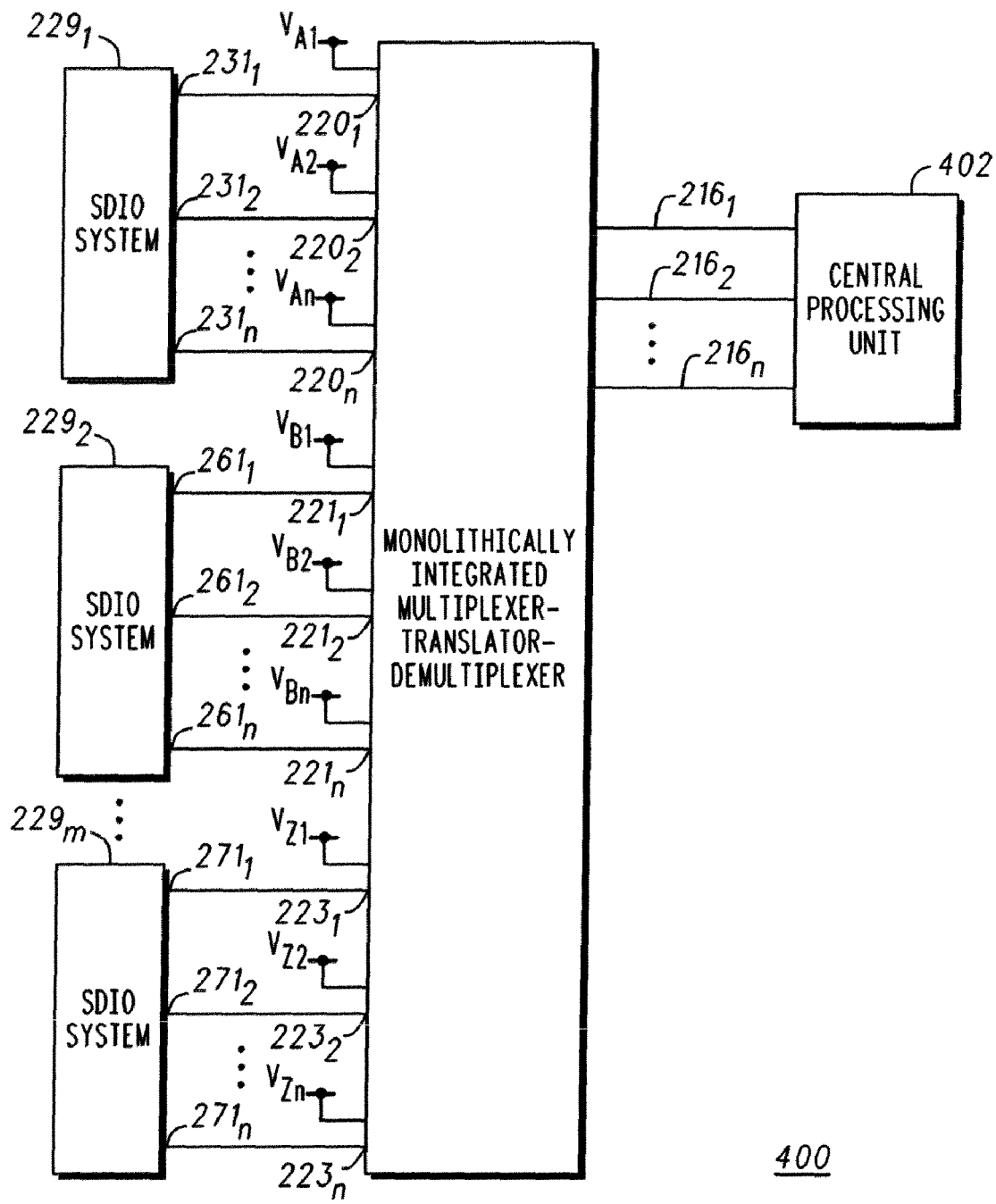
FIG. 7 is a block diagram of a monolithically integrated multiplexer-translator-demultiplexer in accordance with another embodiment of the present invention.

FIG. 7 is a block diagram of a monolithically integrated multiplexer-translator-demultiplexer 400 in accordance with another embodiment of the present invention. What is shown in FIG. 7 are SDIO systems $229_1$, $229_2$, ..., $229_m$, where SDIO system $229_1$ has input/output nodes $231_1$, $231_2$, ..., $231_n$ connected to input/output nodes $220_1$, $220_2$, ..., $220_n$, respectively, of monolithically integrated multiplexer-translator-demultiplexer 200; SDIO system $229_2$ has input/output nodes $261_1$, $261_2$, ..., $261_n$ connected to input/output nodes $221_1$, $221_2$, ..., $221_n$, respectively, of monolithically integrated multiplexer-translator-demultiplexer 200; ..., SDIO system $229_m$ has input/output nodes $271_1$, $271_2$, ..., $271_n$ connected to input/output nodes $223_1$, $223_2$, ..., $223_n$, respectively, of monolithically integrated multiplexer-translator-demultiplexer 200. Input/output node 128 of monolithically integrated multiplexer-translator-demultiplexer 200 is connected to a Central Processing Unit (CPU) 402. CPU 402 includes transceiver circuit 240. It should be noted that monolithically integrated multiplexer-translator-demultiplexer 200, transceivers $229_1$, $229_2$, ..., $229_m$, and transceiver circuit 240 have been described with reference to FIGS. 3A-3D.

By now it should be appreciated that a monolithically integrated multiplexer-translator-demultiplexer and a method for one of multiplexing and leveling shifting a first electrical signal or level shifting and demultiplexing a second electrical signal have been provided. This increases design versatility in permitting interfacing between many different types of systems and circuits. Because the trend in electronics is towards increasing system complexity while decreasing the operating supply voltages, systems and circuits designed using state of the art technology can be interfaced with systems and circuits designed with older and perhaps outdated technologies. For example, the monolithically integrated multiplexer-translator-demultiplexer circuit is capable of being interfaced with different systems that operate at multiple operating voltages.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A monolithically integrated multiplexer-translator-demultiplexer, comprising:
    a first bidirectional data transmission stage having a first node, a second node, and a third node, the third node coupled for receiving a first source of operating potential;
    a second bidirectional data transmission stage having a first node, a second node, and a third node, the first node of the second bidirectional data transmission stage coupled to the second node of the first bidirectional data transmission stage, the second node of the second bidirectional data transmission stage coupled to the first node of the first bidirectional data transmission stage, and the third node of the second bidirectional data transmission stage coupled for receiving a second source of operating potential;
    a third bidirectional data transmission stage having a first node, a second node, and a third node, the second node of the third bidirectional data transmission stage coupled to the first node of the second bidirectional data transmission stage and the third node of the third bidirectional data transmission stage coupled for receiving a third source of operating potential; and
    a fourth bidirectional data transmission stage having a first node, a second node, and a third node, the first node of the fourth bidirectional data transmission stage coupled to the second node of the third bidirectional data transmission stage, the second node of the fourth bidirectional data transmission stage coupled to the first node of the third bidirectional data transmission stage and the third node of the fourth bidirectional data transmission stage coupled for receiving the second source of operating potential.

2. The monolithically integrated multiplexer-translator-demultiplexer of claim 1, wherein the first bidirectional data transmission stage comprises:
    a first transistor having first and second current carrying electrodes and a control electrode, the control electrode coupled for receiving the first source of operating potential, the first current carrying electrode serving as the first node of the first bidirectional data transmission stage and the second current carrying electrode serving as the second node of the first bidirectional data transmission stage;
    a second transistor having first and second current carrying electrodes and a control electrode, the first current carrying electrode of the second transistor coupled for receiving the first source of operating potential and the second current carrying electrode of the second transistor coupled to the first current carrying electrode of the first transistor;
    a first one-shot coupled between the second current carrying electrode of the first transistor and the control electrode of the second transistor; and
    a first resistor coupled from the first current carrying electrode of the second transistor to the second current carrying electrode of the second transistor.

3. The monolithically integrated multiplexer-translator-demultiplexer of claim 2, wherein the second bidirectional data transmission stage comprises:
    a third transistor having a control electrode and first and second current carrying electrodes, the first current carrying electrode of the third transistor serving as the third node of the second bidirectional data transmission stage and the second current carrying electrode of the third transistor serving as the second node of the second bidirectional data transmission stage;
    a second one-shot coupled between the first node of the first bidirectional data transmission stage and the control electrode of the third transistor; and
    a second resistor coupled from the first current carrying electrode of the third transistor to the second current carrying electrode of the third transistor.

4. The monolithically integrated multiplexer-translator-demultiplexer of claim 3, wherein the third bidirectional data transmission stage comprises:
- a fourth transistor having first and second current carrying electrodes and a control electrode, the control electrode coupled for receiving the third source of operating potential, the first current carrying electrode serving as the first node of the third bidirectional data transmission stage and the second current carrying electrode serving as the second node of the third bidirectional data transmission stage;
- a fifth transistor having first and second current carrying electrodes and a control electrode, the first current carrying electrode of the fifth transistor coupled for receiving the first source of operating potential and the second current carrying electrode of the second transistor coupled to the first current carrying electrode of the fourth transistor;
- a third one-shot coupled between the second current carrying electrode of the fourth transistor and the control electrode of the fifth transistor; and
- a third resistor coupled from the first current carrying electrode of the fourth transistor to the second current carrying electrode of the fifth transistor.

5. The monolithically integrated multiplexer-translator-demultiplexer of claim 4, wherein the fourth bidirectional data transmission stage comprises:
- a sixth transistor having a control electrode and first and second current carrying electrodes, the first current carrying electrode of the sixth transistor serving as the third node of the fourth bidirectional data transmission stage and the second current carrying electrode of the sixth transistor serving as the second node of the fourth bidirectional data transmission stage;
- a fourth one-shot coupled between the first current carrying electrode of the fourth transistor and the control electrode of the sixth transistor; and
- a fourth resistor coupled from the first current carrying electrode of the sixth transistor to the second current carrying electrode of the sixth transistor.

6. The monolithically integrated multiplexer-translator-demultiplexer of claim 1, further including a selector that selects at least one bidirectional data transmission stage from the first, second, third, and fourth bidirectional data transmission stages.

7. The monolithically integrated multiplexer-translator-demultiplexer of claim 1, further including first and second transceiver circuits coupled to the first and third bidirectional data transmission stages, respectively.

8. The monolithically integrated multiplexer-translator-demultiplexer of claim 7, further including a third transceiver circuit coupled to the second node of the second bidirectional data transmission stage.

9. The monolithically integrated multiplexer-translator-demultiplexer of claim 1, further including a central processing unit coupled to the second bidirectional data transmission stage and at least two SDIO systems coupled to the first bidirectional data transmission stage.

10. A monolithically integrated multiplexer-translator-demultiplexer, comprising:
- a first conduction channel having at least two inputs and at least two outputs, wherein a first input of the at least two inputs is coupled for receiving a first source of potential, a second input of the at least two inputs serves as a first input/output node, a first output of the at least two outputs is coupled for receiving a second source of potential and a second output of the at least two outputs serves as a second input/output node; and
- a second conduction channel having at least two inputs and at least two outputs, wherein a first input of the at least two inputs is coupled for receiving a third source of potential, a second input of the at least two inputs serves as a third input/output node, a first output of the at least two outputs is coupled to the first output of the at least two outputs of the first conduction channel and a second output of the at least two outputs is coupled to the second output of the at least two outputs of the first conduction channel.

11. The monolithically integrated multiplexer-translator-demultiplexer of claim 10, wherein the first conduction channel comprises:
- a first transistor having first and second current carrying electrodes and a control electrode, the control electrode coupled for receiving the first source of potential, the first current carrying electrode serving as the first input/output node of the first conduction channel and the second current carrying electrode serving as the second input/output node of the first conduction channel;
- a second transistor having first and second current carrying electrodes and a control electrode, the first current carrying electrode of the second transistor coupled for receiving the first source of potential and the second current carrying electrode of the second transistor coupled to the first current carrying electrode of the first transistor;
- a first one-shot coupled between the second current carrying electrode of the first transistor and the control electrode of the second transistor;
- a first resistor coupled from the first current carrying electrode of the second transistor to the second current carrying electrode of the second transistor,
- a third transistor having a control electrode and first and second current carrying electrodes, the first electrode of the third transistor serving as the third node of the second conduction channel and the second electrode of the third transistor serving as the second input/output node of the second conduction channel;
- a second one-shot coupled between the first node of the first conduction channel and the control electrode of the third transistor; and
- a second resistor coupled from the first current carrying electrode of the third transistor to the second current carrying electrode of the third transistor.

12. The monolithically integrated multiplexer-translator-demultiplexer of claim 11, wherein the second conduction channel comprises:
- a fourth transistor having first and second current carrying electrodes and a control electrode, the control electrode coupled for receiving the second source of potential, the first current carrying electrode serving as the third input/output node of the second conduction channel and the second current carrying electrode serving as the fourth input/output node of the second conduction channel;
- a fifth transistor having first and second current carrying electrodes and a control electrode, the first current carrying electrode of the fifth transistor coupled for receiving the second source of potential and the second current carrying electrode of the fifth transistor coupled to the first current carrying electrode of the fourth transistor;
- a third one-shot coupled between the second current carrying electrode of the fourth transistor and the control electrode of the fifth transistor;

a third resistor coupled from the first current carrying electrode of the fifth transistor to the second current carrying electrode of the fifth transistor;

a sixth transistor having a control electrode and first and second current carrying electrodes, the first electrode of the sixth transistor serving as the third input/output node of the second conduction channel and the second electrode of the sixth transistor serving as the second input/output node of the second conduction channel;

a fourth one-shot coupled between the first node of the second conduction channel and the control electrode of the sixth transistor; and a fourth resistor coupled from the first current carrying electrode of the sixth transistor to the second current carrying electrode of the sixth transistor.

13. The monolithically integrated multiplexer-translator-demultiplexer of claim 10, further including:

a third conduction channel having at least two inputs and at least two outputs, wherein a first input of the at least two inputs is coupled for receiving a fourth source of potential, a second input of the at least two inputs serves as a fourth input/output node, a first output of the at least two outputs is coupled to the first output of the at least two outputs of the first conduction channel and a second output of the at least two outputs is coupled to the second output of the at least two outputs of the first conduction channel.

14. The monolithically integrated multiplexer-translator-demultiplexer of claim 13, wherein the third conduction channel comprises:

a first transistor having first and second current carrying electrodes and a control electrode, the control electrode coupled for receiving the first source of potential, the first current carrying electrode serving as the fourth input/output node of the third conduction channel and the second current carrying electrode coupled to the second input/output node of the first conduction channel;

a second transistor having first and second current carrying electrodes and a control electrode, the first current carrying electrode of the second transistor coupled for receiving the fourth source of potential and the second current carrying electrode of the second transistor coupled to the first current carrying electrode of the first transistor;

a first one-shot coupled between the second current carrying electrode of the first transistor and the control electrode of the second transistor;

a first resistor coupled from the first current carrying electrode of the second transistor to the second current carrying electrode of the second transistor;

a third transistor having a control electrode and first and second current carrying electrodes, the first electrode of the third transistor coupled to the third node of the second conduction channel and the second electrode of the third transistor serving as the second input/output node of the first conduction channel;

a second one-shot coupled between the first node of the third conduction channel and the control electrode of the third transistor; and a second resistor coupled from the first current carrying electrode of the third transistor to the second current carrying electrode of the third transistor.

15. A method for one of multiplexing and leveling shifting a first electrical signal or level shifting and demultiplexing a second electrical signal, comprising:

multiplexing and level shifting the electrical signal by:
providing a plurality of electrical signals to a monolithically integrated circuit;
using the monolithically integrated circuit to select the first electrical signal of the plurality of electrical signals; and
adjusting a signal level of the selected first electrical signal to form a level shifted first electrical signal; or
demultiplexing the second electrical signal by:
providing a second electrical signal to the monolithically integrated circuit;
using the monolithically integrated circuit to adjust the signal level of the second electrical signal to form a level shifted second electrical signal; and
transmitting the level shifted second electrical signal to a plurality of input/output nodes.

16. The method of claim 15, wherein providing the second electrical signal includes providing the second electrical signal from a central processing unit.

17. The method of claim 15, wherein providing the plurality of electrical signals to the monolithically integrated circuit includes providing a plurality of electrical signals as a plurality of voltage signals.

18. A method for multiplexing and level shifting electrical signals, comprising:

providing a plurality of electrical signals to a monolithically integrated circuit, wherein the monolithically integrated circuit comprises a plurality of conduction channels and wherein each electrical signal of the plurality of electrical signals corresponds to a conduction channel of the plurality of conduction channels and wherein one or more of the conduction channels of the plurality of conduction channels is capable of transmitting an electrical signal in first and second directions, the second direction opposite that of the first direction;

using the monolithically integrated circuit to select an electrical signal of the plurality of electrical signals; and adjusting a signal level of the selected electrical signal to form a level shifted selected electrical signal, wherein adjusting the signal level of the selected electrical signal includes increasing the electrical signal.

19. The method of claim 18, wherein the electrical signal is a voltage signal.

20. A method for multiplexing and level shifting electrical signals, comprising:

providing a plurality of electrical signals to a monolithically integrated circuit, wherein the monolithically integrated circuit comprises a plurality of conduction channels and wherein each electrical signal of the plurality of electrical signals corresponds to a conduction channel of the plurality of conduction channels and wherein one or more of the conduction channels of the plurality of conduction channels is capable of transmitting an electrical signal in first and second directions, the second direction opposite that of the first direction;

using the monolithically integrated circuit to select an electrical signal of the plurality of electrical signals; and adjusting a signal level of the selected electrical signal to form a level shifted selected electrical signal, wherein adjusting the signal level of the selected electrical signal includes decreasing the electrical signal.

* * * * *